(12) United States Patent
Shi et al.

(10) Patent No.: US 11,791,772 B2
(45) Date of Patent: Oct. 17, 2023

(54) OSCILLATOR AND DEVICE

(71) Applicant: HUAWEI TECHNOLOGIES CO., LTD., Guangdong (CN)

(72) Inventors: Kai Shi, Shanghai (CN); Lei Lu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/492,463

(22) Filed: Oct. 1, 2021

(65) Prior Publication Data
US 2022/0029584 A1 Jan. 27, 2022

Related U.S. Application Data

(63) Continuation of application No. PCT/CN2019/081580, filed on Apr. 4, 2019.

(51) Int. Cl.
H03B 5/12 (2006.01)
(52) U.S. Cl.
CPC ......... *H03B 5/1212* (2013.01); *H03B 5/1228* (2013.01)
(58) Field of Classification Search
CPC .................................... H03B 5/1212
USPC ..................................... 331/117 FE
See application file for complete search history.

(56) References Cited

U.S. PATENT DOCUMENTS

| 2009/0021513 A1 | 1/2009 | Joshi et al. |
| 2009/0033428 A1* | 2/2009 | Karri ............ H03B 5/1228 331/17 |
| 2009/0134947 A1* | 5/2009 | Tarng ............ H03B 5/04 331/116 FE |

FOREIGN PATENT DOCUMENTS

| CN | 102508644 A | 6/2012 |
| CN | 103502983 A | 1/2014 |
| CN | 106504305 A | 3/2017 |
| CN | 107066430 A | 8/2017 |
| CN | 107464208 A | 12/2017 |

OTHER PUBLICATIONS

PCT International Search Report and Written Opinion issued in International Application No. PCT/CN2020/078663 dated Jun. 4, 2020, 14 p0ages (with English translation).

* cited by examiner

*Primary Examiner* — Joseph Chang
(74) *Attorney, Agent, or Firm* — Fish & Richardson P.C.

(57) ABSTRACT

Example oscillators and oscillator-based apparatus are described. One example oscillator includes: a resonant circuit, configured to generate an oscillator signal; a first cross-coupled transistor, coupled to the resonant circuit; and a power supply circuit, configured to supply a power supply signal for the first cross-coupled transistor based on a first voltage and a second voltage, where the first voltage is a power supply voltage, and the second voltage is a voltage generated by an external sensing circuit. Because an oscillation frequency of the oscillator changes with the power supply signal of the oscillator, the oscillation frequency of the oscillator can be compensated by adjusting the power supply signal.

12 Claims, 13 Drawing Sheets

OSCILLATOR AND DEVICE

CROSS-REFERENCE TO RELATED APPLICATIONS

This application is a continuation of International Application No. PCT/CN2019/081580, filed on Apr. 4, 2019, the disclosure of which is hereby incorporated by reference in its entirety.

TECHNICAL FIELD

This application relates to the field of electronic technologies, and in particular, to an oscillator and a device.

BACKGROUND

A phase-locked loop (PLL) is an important element in a communications system, and is widely used. The phase-locked loop mainly includes a charge pump analog phase-locked loop (CPPLL) based on a voltage-controlled oscillator (VCO) and an all-digital phase-locked loop (ADPLL) based on a digitally-controlled oscillator (DCO). The oscillator (VCO/DCO) is a core element of the phase-locked loop. Functions and performance of the oscillator directly affect functions and performance of the phase-locked loop. Usually, an oscillation frequency of the oscillator (VCO/DCO) changes with an external environment. For example, the oscillation frequency of the oscillator decreases as a temperature increases. Therefore, the phase-locked loop needs an additional compensation circuit for frequency compensation, to keep an output frequency unchanged.

In the conventional technology, when the CPPLL or the ADPLL uses the additional compensation circuit for frequency compensation, a large quantity of varactors need to be disposed inside the VCO of the CPPLL or the DCO of the ADPLL, to ensure a relatively wide frequency compensation range of the oscillator (VCO/DCO) by using the large quantity of varactors. However, the large quantity of varactors cause performance of the oscillator (VCO/DCO) such as phase noise and spur to deteriorate, and also occupy a relatively large area, thereby increasing a design difficulty of the oscillator.

SUMMARY

This application provides an oscillator and a device using the oscillator, to improve performance of the oscillator, reduce an occupied area of the oscillator, and simplify a design of the oscillator.

To achieve the foregoing objective, technical solutions used in this application are as follows.

According to a first aspect, an oscillator is provided, including: a resonant circuit, configured to generate an oscillator signal; a first cross-coupled transistor, coupled to the resonant circuit; and a power supply circuit, configured to supply a power supply signal for the first cross-coupled transistor based on a first voltage and a second voltage, where the first voltage is a power supply voltage, and the second voltage is a voltage generated by an external sensing circuit. In the foregoing technical solution, because an oscillation frequency of the oscillator changes with the power supply signal of the first cross-coupled transistor in the oscillator, the oscillation frequency of the oscillator can be compensated by adjusting the power supply signal, so that performance of the oscillator is improved. Compared with the conventional technology, this can reduce an occupied area of the oscillator and simply a design of the oscillator because a large quantity of varactors do not need to be disposed inside the oscillator for frequency compensation.

In a possible implementation of the first aspect, the first voltage is a fixed voltage, and the second voltage is a variable voltage. In the possible implementation, the power supply signal is controlled by the fixed voltage and the variable voltage, so that the oscillation frequency of the oscillator can be compensated by using the variable voltage. This improves the performance of the oscillator.

In a possible implementation of the first aspect, the fixed voltage is a positive voltage of a fixed power supply, or the fixed voltage is a negative voltage of a fixed power supply.

In a possible implementation of the first aspect, the power supply signal supplied by the power supply circuit is a voltage signal or a current signal. Optionally, when the power supply signal is the voltage signal, the power supply circuit includes an adder, and the adder is configured to add the first voltage and the second voltage to obtain the voltage signal. Alternatively, when the power supply signal is the current signal, the power supply circuit includes a power supply transistor, a source of the power supply transistor is configured to receive the first voltage, a gate of the power supply transistor is configured to receive the second voltage, and a drain of the power supply transistor is configured to output the current signal.

In a possible implementation of the first aspect, the external sensing circuit is configured to generate the second voltage based on a temperature, or the external sensing circuit is configured to generate the second voltage based on a mechanical pressure, or the external sensing circuit is configured to generate the second voltage based on a mechanical vibration. In the possible implementation, the external sensing circuit can compensate for the oscillation frequency of the oscillator based on different parameters of an external environment in which the oscillator is located, thereby improving the performance of the oscillator.

In a possible implementation of the first aspect, the first cross-coupled transistor includes a first MOS transistor and a second MOS transistor. A source of the first MOS transistor and a source of the second MOS transistor are coupled to a first node. A gate of the first MOS transistor, a drain of the second MOS transistor, and a first terminal of the resonant circuit are coupled to a second node. A drain of the first MOS transistor, a gate of the second MOS transistor, and a second terminal of the resonant circuit are coupled to a third node. The first node is configured to receive the power supply signal. In the possible implementation, a simple and effective implementation of the first cross-coupled transistor is provided. Therefore, complexity of the oscillator can be simplified, and the occupied area of the oscillator can be reduced.

In a possible implementation of the first aspect, the oscillator further includes a second cross-coupled transistor. The second cross-coupled transistor includes a third MOS transistor and a fourth MOS transistor. A source of the third MOS transistor and a source of the fourth MOS transistor are coupled to a fourth node. A gate of the third MOS transistor, a drain of the fourth MOS transistor, and the first terminal of the resonant circuit are coupled to the second node. A drain of the third MOS transistor, a gate of the fourth MOS transistor, and the second terminal of the resonant circuit are coupled to the third node. The fourth node is coupled to a positive terminal or a negative terminal of power supply. In the possible implementation, the provided implementation of the cross-coupled transistor can improve the performance of the oscillator.

In a possible implementation of the first aspect, the resonant circuit includes an inductor, a first varactor, a second varactor, and a switched capacitor array. Two terminals of the inductor are coupled to the second node and the third node. One terminal of the first varactor is coupled to one terminal of the second varactor, and the other terminal of the first varactor and the other terminal of the second varactor are respectively coupled to the second node and the third node. Two terminals of the switched capacitor array are coupled to the second node and the third node. In the possible implementation, a simple and effective implementation of the resonant circuit is provided. Therefore, the complexity of the oscillator can be simplified, and the occupied area of the oscillator can be reduced.

In a possible implementation of the first aspect, the oscillator further includes: a digital-to-analog converter, configured to: when a voltage generated by the external sensing circuit is a digital voltage, convert the digital voltage into an analog voltage, to obtain the second voltage.

Optionally, the digital-to-analog converter includes a switch array, and a plurality of resistors connected in series with each other between a power supply terminal and a ground terminal. A connection point between two adjacent resistors among the plurality of resistors connected in series with each other is connected to one switch in the switch array. The digital-to-analog converter is configured to control a switch that is in the switch array and that corresponds to the digital voltage to be closed, to convert the digital voltage into the analog voltage.

According to a second aspect, an oscillator is provided, including: a resonant circuit, configured to generate an oscillator signal; and a first cross-coupled circuit, coupled to the resonant circuit. The first cross-coupled circuit includes a first MOS transistor and a second MOS transistor that are cross-coupled, and a body of the first MOS transistor and a body of the second MOS transistor are configured to receive a variable control voltage. In the foregoing technical solution, because an oscillation frequency of the oscillator changes with a body voltage of the first MOS transistor and a body voltage of the second MOS transistor in the first cross-coupled circuit, the oscillation frequency of the oscillator can be compensated by adjusting the variable control voltage to adjust the body voltages of the MOS transistors, so that performance of the oscillator can be improved. Compared with the conventional technology, this reduces an occupied area of the oscillator and simplifies a design of the oscillator because a large quantity of varactors do not need to be disposed inside the oscillator.

In a possible implementation of the second aspect, the variable control voltage is a voltage generated based on at least one of the following parameters: a temperature, a mechanical pressure, or a mechanical vibration. In the possible implementation, the oscillation frequency of the oscillator can be compensated based on different parameters of an external environment in which the oscillator is located, so that the performance of the oscillator is improved.

In a possible implementation of the second aspect, the variable control voltage is a voltage generated by an external sensing circuit based on a temperature of the oscillator, or the variable control voltage is a voltage generated by an external sensing circuit based on a mechanical pressure of the oscillator, or the variable control voltage is a voltage generated by an external sensing circuit based on a mechanical vibration of the oscillator.

In a possible implementation of the second aspect, the body of the first MOS transistor is coupled to the body of the second MOS transistor to receive the variable control voltage. A source of the first MOS transistor and a source of the second MOS transistor are coupled to a first node to couple to a first power supply terminal. A gate of the first MOS transistor, a drain of the second MOS transistor, and a first terminal of the resonant circuit are coupled to a second node. A drain of the first MOS transistor, a gate of the second MOS transistor, and a second terminal of the resonant circuit are coupled to a third node. In the possible implementation, a simple and effective implementation of the first cross-coupled circuit is provided. Therefore, complexity of the oscillator can be simplified, and the occupied area of the oscillator can be reduced.

In a possible implementation of the second aspect, the oscillator further includes a second cross-coupled circuit. The second cross-coupled transistor includes a third MOS transistor and a fourth MOS transistor that are cross-coupled. A gate of the third MOS transistor, a drain of the fourth MOS transistor, and the first terminal of the resonant circuit are coupled to the second node. A drain of the third MOS transistor, a gate of the fourth MOS transistor, and the second terminal of the resonant circuit are coupled to the third node. A source of the third MOS transistor and a source of the fourth MOS transistor are coupled to a fourth node to couple to a second power supply terminal. In the possible implementation, the performance of the oscillator can be further improved.

In a possible implementation of the second aspect, a body of the third MOS transistor and a body of the fourth MOS transistor are coupled to a fifth node, where the fifth node is configured to receive the variable control voltage, or the first node is configured to couple to the second power supply terminal. In the possible implementation, the provided implementation of the second cross-coupled circuit can further improve the performance of the oscillator.

In a possible implementation of the second aspect, the resonant circuit includes an inductor, a first varactor, a second varactor, and a switched capacitor array. Two terminals of the inductor are coupled to the second node and the third node. One terminal of the first varactor is coupled to one terminal of the second varactor, and the other terminal of the first varactor and the other terminal of the second varactor are respectively coupled to the second node and the third node. Two terminals of the switched capacitor array are coupled to the second node and the third node. In the possible implementation, a simple and effective implementation of the resonant circuit is provided. Therefore, the complexity of the oscillator can be simplified, and the occupied area of the oscillator can be reduced.

In a possible implementation of the second aspect, the oscillator further includes: a digital-to-analog converter, configured to: when a voltage generated by the external sensing circuit is a digital voltage, convert the digital voltage into an analog voltage, to obtain the variable control voltage.

Optionally, the digital-to-analog converter includes a switch array, and a plurality of resistors connected in series with each other between a power supply terminal and a ground terminal. A connection point between two adjacent resistors among the plurality of resistors connected in series with each other is connected to one switch in the switch array. The digital-to-analog converter is configured to control a switch that is in the switch array and that corresponds to the digital voltage to be closed, to convert the digital voltage into the analog voltage.

According to a third aspect, a phase-locked loop is provided. The phase-locked loop includes: a phase frequency detector, a filter, an external sensing circuit, and the oscillator provided in any one of the first aspect or the possible implementations of the first aspect. The oscillator is configured to generate an oscillator signal. The phase frequency detector and the filter are configured to generate, based on the oscillator signal, a loop voltage that meets a specific phase requirement. The external sensing circuit is configured to generate a second voltage based on at least one of the following parameters: a temperature, a mechanical pressure, or a mechanical vibration. The external sensing circuit is further configured to output the second voltage to the power supply circuit in the oscillator.

According to a fourth aspect, a phase-locked loop is provided. The phase-locked loop includes: a phase frequency detector, a filter, an external sensing circuit, and the oscillator provided in any one of the second aspect or the possible implementations of the second aspect. The oscillator is configured to generate an oscillator signal. The phase frequency detector and the filter are configured to generate, based on the oscillator signal, a loop voltage that meets a specific phase requirement. The external sensing circuit is configured to generate a variable control voltage based on at least one of the following parameters. The external sensing circuit is further configured to output the variable control voltage to the bodies of the MOS transistors of the first cross-coupled transistor in the oscillator.

According to another aspect of this application, an oscillator-based apparatus is further provided. The apparatus includes a radio frequency circuit and the oscillator provided in any one of the first aspect or the possible implementations of the first aspect. The oscillator is configured to supply a local carrier signal for the radio frequency circuit. Optionally, the apparatus may be a terminal, a base station, a chip built in the terminal or the base station, or the like.

According to another aspect of this application, an oscillator-based apparatus is further provided. The terminal includes a radio frequency circuit and the oscillator provided in any one of the second aspect or the possible implementations of the second aspect. The oscillator is configured to supply a local carrier signal for the radio frequency circuit. Optionally, the apparatus may be a terminal, a base station, a chip built in the terminal or the base station, or the like.

It may be understood that any one of the foregoing described phase-locked loops includes the foregoing described oscillator. Therefore, for beneficial effects that can be achieved by the any one of the phase-locked loops, refer to beneficial effects of the foregoing described oscillator. Details are not described herein again.

DESCRIPTION OF EMBODIMENTS

In this application, "at least one" refers to one or more, and "a plurality of" refers to two or more than two. The term "and/or" describes an association relationship for describing associated objects and represents that three relationships may exist. For example, A and/or B may represent the following three cases: Only A exists, both A and B exist, and only B exists, where A and B may be singular or plural. "At least one of the following items" or a similar expression thereof refers to any combination of these items, including a single item or any combination of a plurality of items. For example, at least one of a, b, or c may represent: a, b, c, a and b, a and c, b and c, or a, b, and c, where a, b, and c may be singular or plural. The character "I" generally indicates an "or" relationship between the associated objects. In addition, in the embodiments of this application, the words such as "first" and "second" do not limit a quantity and an execution order.

It should be noted that, in this application, the word such as "exemplary", "for example", or the like is used to represent giving an example, an illustration, or a description. Any embodiment or design solution described as an "exemplary" or "for example" in this application should not be explained as being more preferred or having more advantages than another embodiment or design solution. Exactly, use of the word such as "exemplary", "example", or the like is intended to present a relative concept in a specific manner.

Figure 1:
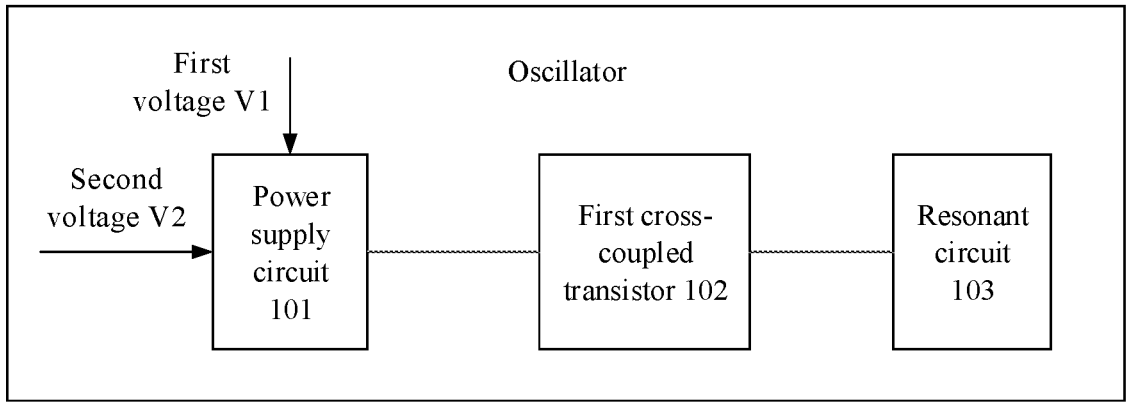
FIG. 1 is a schematic structural diagram 1 of an oscillator according to an embodiment of this application.

FIG. 1 is a schematic structural diagram of an oscillator according to an embodiment of this application. Refer to FIG. 1. The oscillator includes a power supply circuit 101, a first cross-coupled transistor 102, and a resonant circuit 103. The first cross-coupled transistor 102 is configured to compensate for energy consumption of the resonant circuit 103, namely, negative resistance compensation. The resonant circuit 103 is configured to generate an oscillator signal.

In this embodiment of this application, the power supply circuit 101 is configured to supply a power supply signal for the first cross-coupled transistor 102 based on a first voltage V1 and a second voltage V2. The power supply signal may be a voltage signal $V_O$ obtained by adding the first voltage V1 and the second voltage V2, or the power supply signal is a current signal $I_O$ controlled by the first voltage V1 and the second voltage V2.

The first voltage V1 may be a fixed voltage. Optionally, the fixed voltage may be supplied by a fixed power supply, and the fixed voltage may be a positive voltage VDD supplied by the fixed power supply or a negative voltage VSS (the negative voltage VSS may be specifically a ground terminal GND) supplied by the fixed power supply. The second voltage V2 is a variable voltage. Optionally, the second voltage V2 may be generated by an external sensing circuit. For example, the second voltage V2 may be a voltage generated by at least one of a temperature sensing circuit, a pressure sensing circuit, or a vibration sensing circuit.

Optionally, the external sensing circuit may be configured to generate the second voltage V2 based on a temperature, a mechanical pressure, a mechanical vibration, or the like of an external environment in which the oscillator is located. For example, the external sensing circuit generates the second voltage V2 based on a temperature, a mechanical pressure, a mechanical vibration, or the like of a chip in which the oscillator is located. For example, the oscillator may be used in a phase-locked loop. The external sensing circuit may be configured to compare a reference voltage with a loop voltage of the phase-locked loop to generate the second voltage V2, or the external sensing circuit may be configured to generate the second voltage based on one of the following parameters of the phase-locked loop: a temperature, a mechanical pressure, or a mechanical vibration.

For example, the temperature sensing circuit may generate a variable voltage based on a change of a temperature of the oscillator or the phase-locked loop using the oscillator, the pressure sensing circuit may generate a variable voltage based on a change of a mechanical pressure received by the oscillator or the phase-locked loop using the oscillator, or the vibration sensing circuit may generate a variable voltage based on changes of a frequency and magnitude of a vibration received by the oscillator or the phase-locked loop using the oscillator. In practical application, the external sensing circuit may include a sensor, or may include a sensor, another circuit that cooperates with the sensor, and the like. For example, the temperature sensing circuit may include a temperature sensor and another circuit other than the temperature sensor in a temperature compensation loop, for example, a comparator.

In practical application, the external sensing circuit may further include another sensing circuit. The another sensing circuit may be configured to detect a voltage generated by a change of another external factor (an external factor other than the temperature, the mechanical pressure, and the mechanical vibration) that affects an oscillation frequency of the oscillator. This is not specifically limited in this embodiment of this application.

Figure 2:
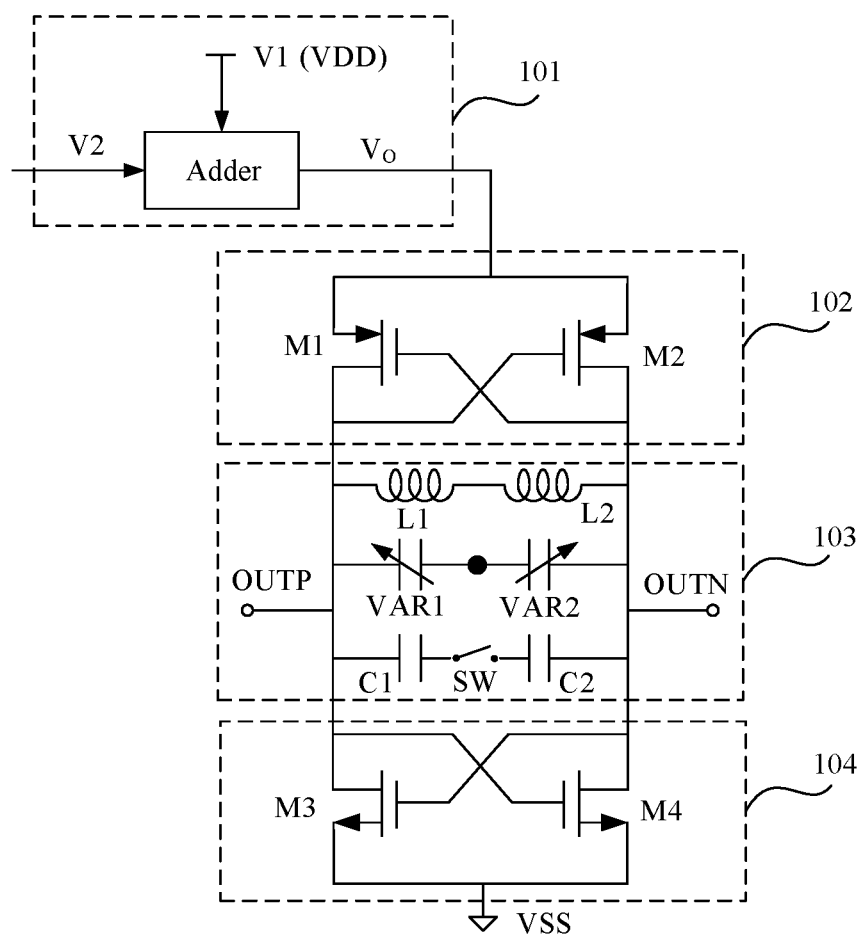
FIG. 2 is a schematic structural diagram 2 of an oscillator according to an embodiment of this application.
Figure 3:
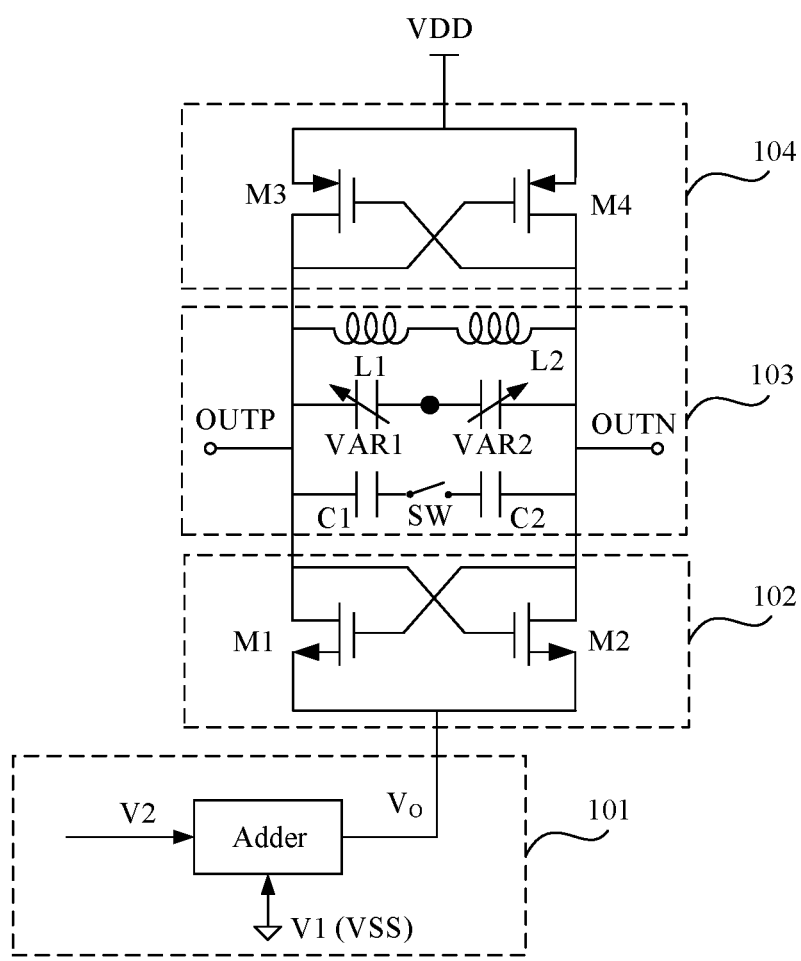
FIG. 3 is a schematic structural diagram 3 of an oscillator according to an embodiment of this application.

Specifically, as shown in FIG. 2 and FIG. 3, the power supply circuit 101 may include an adder. The adder is configured to: receive the first voltage V1 and the second voltage V2, and add the first voltage V1 and the second voltage V2 to obtain the voltage signal $V_O$. In this case, the power supply signal is the voltage signal $V_O$. When the first voltage V1 is the positive voltage VDD supplied by the fixed power supply, the oscillator may be shown in FIG. 2. When the first voltage V1 is the negative voltage VSS supplied by the fixed power supply, the oscillator may be shown in FIG. 3.

Figure 4:
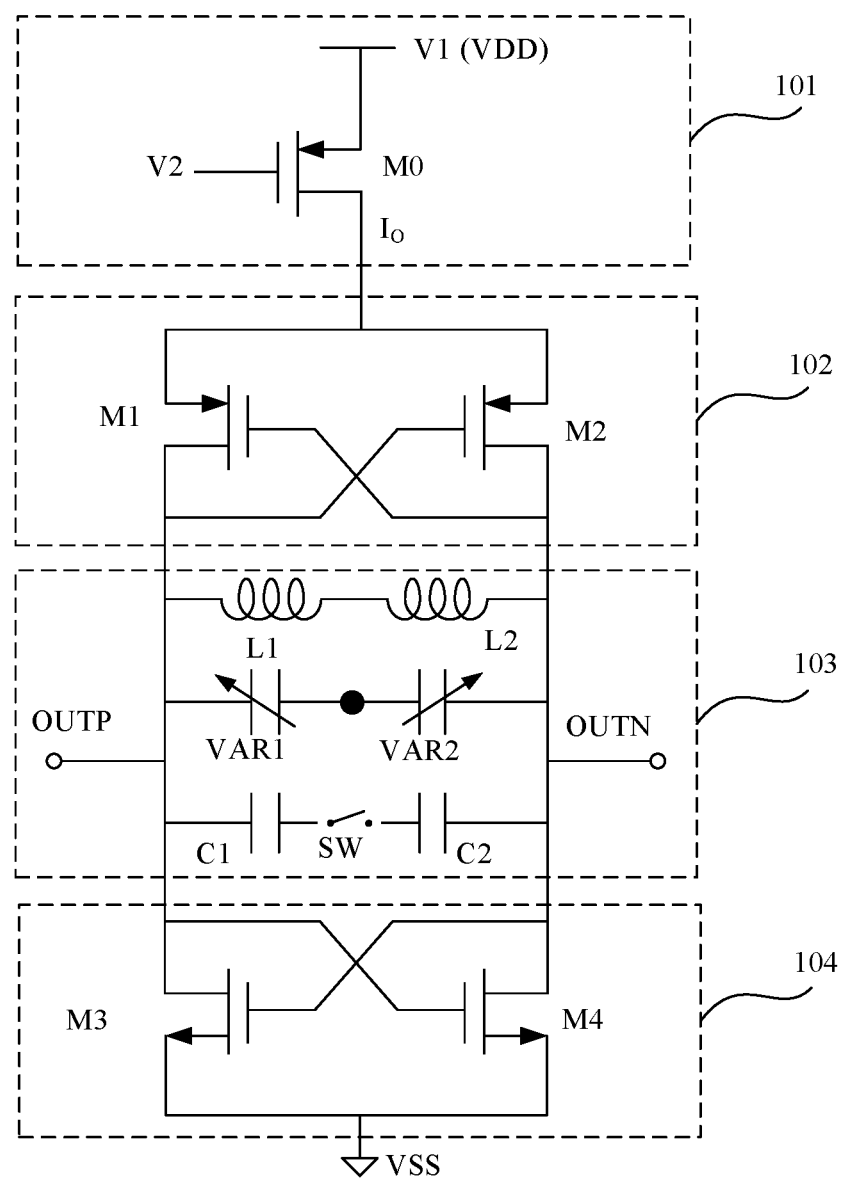
FIG. 4 is a schematic structural diagram 4 of an oscillator according to an embodiment of this application.
Figure 5:
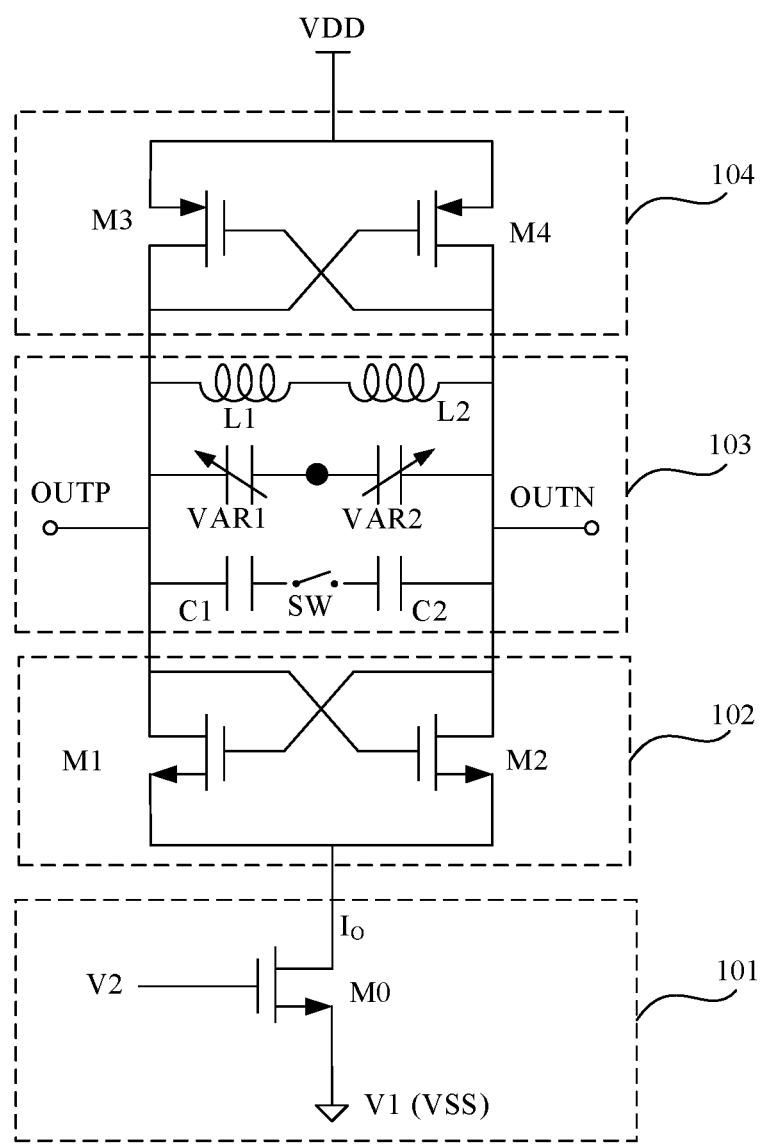
FIG. 5 is a schematic structural diagram 5 of an oscillator according to an embodiment of this application.

Alternatively, as shown in FIG. 4 and FIG. 5, the power supply circuit 101 may include a power supply transistor M0. The power supply transistor may be a voltage-controlled transistor, for example, a metal oxide semiconductor (MOS) transistor or an insulated-gate bipolar transistor (IGBT). The following provides descriptions by using the MOS transistor M0 as an example. The MOS transistor M0 is configured to: receive the first voltage V1 and the second voltage V2, and generate the current signal $I_O$ under control of the first voltage V1 and the second voltage V2. In other words, the first voltage V1 and the second voltage V2 control the MOS transistor M0 to generate the current signal $I_O$ when the MOS transistor M0 is turned on. In this case, the power supply signal is the current signal $I_O$. When the first voltage V1 is the positive voltage VDD supplied by the fixed power supply, the oscillator may be shown in FIG. 4. When the first voltage V1 is the negative voltage VSS supplied by the fixed power supply, the oscillator may be shown in FIG. 5.

It should be noted that, the MOS transistor M0 included in the power supply circuit 101 may be an NMOS transistor or a PMOS transistor, or may be replaced with another element or circuit having a same function as the power supply MOS transistor M0. In FIG. 4 and FIG. 5, that the power supply MOS transistor M0 is an NMOS transistor is merely an example for description, and this does not constitute any limitation on this embodiment of this application.

Optionally, as shown in FIG. 2 to FIG. 5, the first cross-coupled transistor 102 may include a first MOS transistor M1 and a second MOS transistor M2. A source (s) of the first MOS transistor M1 and a source of the second MOS transistor M2 are coupled to a first node. A drain (d) of the first MOS transistor M1, a gate (g) of the second MOS transistor M2, and a first terminal of the resonant circuit 103 are coupled to a second node (denoted as OUTP). A gate of the first MOS transistor M1, a drain of the second MOS transistor M2, and a second terminal of the resonant circuit 103 are coupled to a third node (denoted as OUTN). OUTN and OUTP are configured to output an oscillator signal.

It should be noted that, an example in which the power supply circuit 101 includes the adder and the first voltage V1 is the positive voltage VDD supplied by the fixed power supply in FIG. 2 is used for description, an example in which the power supply circuit 101 includes the adder and the first voltage V1 is the negative voltage VSS supplied by the fixed power supply in FIG. 3 is used for description, an example in which the power supply circuit 101 includes the MOS transistor M0 and the first voltage V1 is the positive voltage VDD supplied by the fixed power supply in FIG. 4 is used for description, and an example in which the power supply circuit 101 includes the MOS transistor M0 and the first voltage V1 is the negative voltage VSS supplied by the fixed power supply in FIG. 5 is used for description.

In practical application, the oscillator may include one cross-coupled transistor, or may include two cross-coupled transistors: the first cross-coupled transistor 102 and a second cross-coupled transistor 104. The second cross-coupled transistor 104 includes a third MOS transistor M3 and a fourth MOS transistor M4. A source of the third MOS transistor M3 and a source of the fourth MOS transistor M4 are coupled to a fourth node. A drain of the third MOS transistor M3 and a gate of the fourth MOS transistor M4 are coupled to the second node. A gate of the third MOS transistor and a drain of the fourth MOS transistor are coupled to the third node.

It should be noted that, the MOS transistors included in the first cross-coupled transistor 102 and the second cross-coupled transistor 104 each may be a cross-coupled pair formed by using NMOS transistors, or may be a cross-coupled pair formed by using PMOS transistors. In FIG. 2 to FIG. 5, the first cross-coupled transistor 102 and the second cross-coupled transistor 104 are merely examples, and do not constitute any limitation on this embodiment of this application.

Optionally, as shown in FIG. 2 to FIG. 5, the resonant circuit 103 may include: a first inductor L1, a second inductor L2, a first varactor VAR1, a second varactor VAR2, and a switched capacitor array. In FIG. 2 to FIG. 5, an example in which the switched capacitor array includes a first capacitor C1 and a second capacitor C2, and one terminal of the first capacitor C1 is connected to one terminal of the second capacitor C2 by using a switch (SW) is used for description.

One terminal of the first varactor VAR1 is coupled to one terminal of the second varactor VAR2. One terminal of the first inductor L1 is coupled to one terminal of the second inductor L2. The other terminal of the first inductor L1, the other terminal of the first varactor VAR1, and one terminal of the switched capacitor array (which is specifically the other terminal of the first capacitor C1) are all coupled to OUTP. The other terminal of the second inductor L2, the other terminal of the second varactor VAR2, and the other terminal of the switched capacitor array (which is specifically the other terminal of the second capacitor C2) are all coupled to OUTN.

In practical application, the resonant circuit 103 may be alternatively a circuit of another structure. For example, the first inductor L1 and the second inductor L2 are implemented by using one inductor, and the switched capacitor array is a capacitor array of another form. The specific structure of the resonant circuit 103 in FIG. 2 to FIG. 5 is merely an example, and does not constitute any limitation on this embodiment of this application.

Further, the oscillator may be a voltage-controlled oscillator (VCO) or a digitally-controlled oscillator (DCO). When the oscillator is the VCO, the first varactor VAR1 and the second varactor VAR2 in the resonant circuit 103 may be specifically controlled by an analog signal. When the oscillator is the DCO, the first varactor VAR1 and the second varactor VAR2 in the resonant circuit 103 may be specifically controlled by a digital signal.

Figure 6:
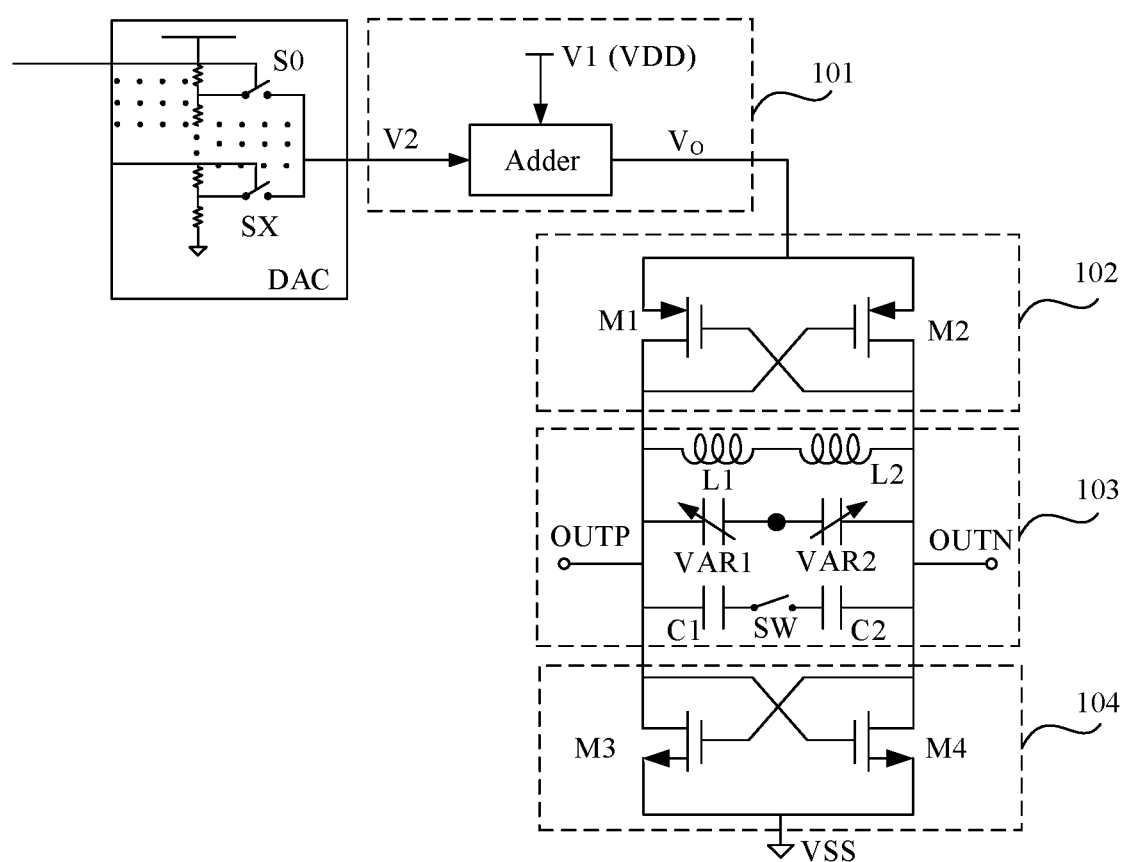
FIG. 6 is a schematic structural diagram 6 of an oscillator according to an embodiment of this application.
Figure 7:
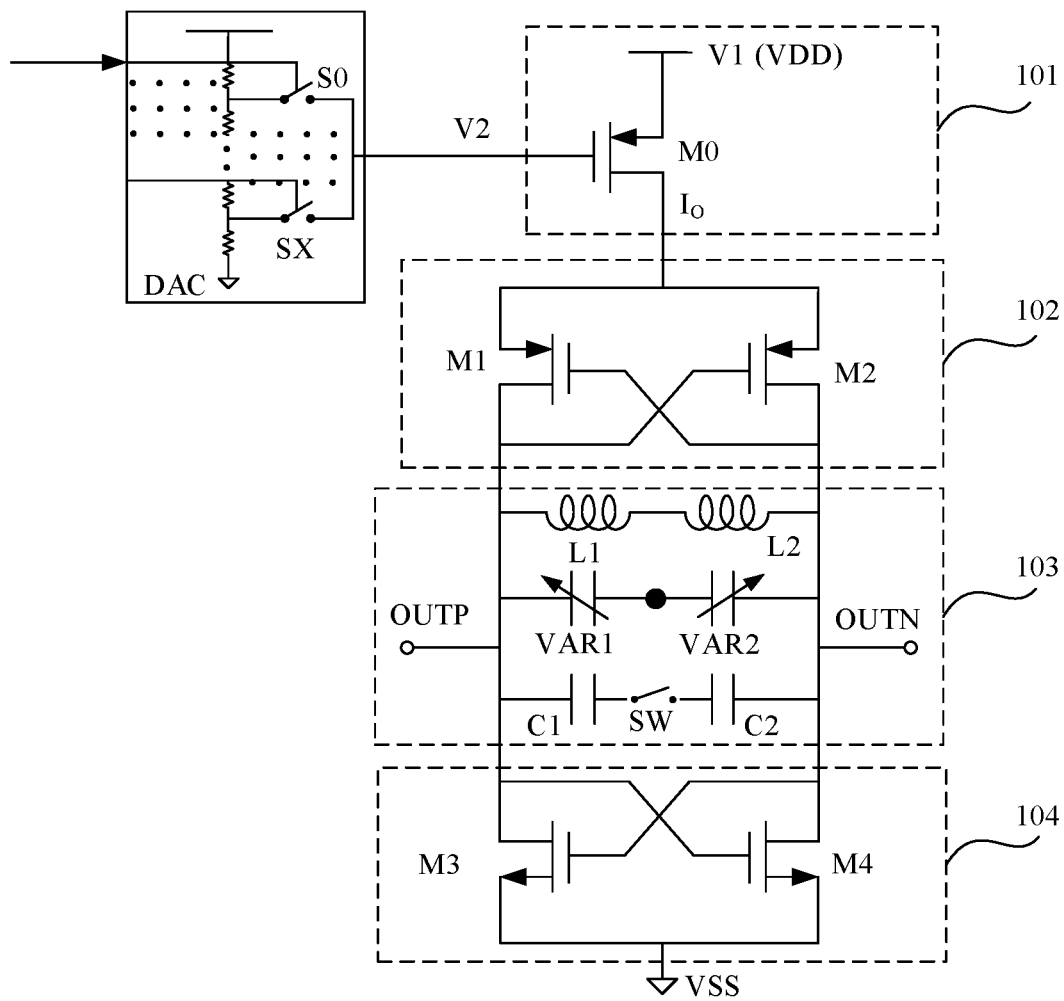
FIG. 7 is a schematic structural diagram 7 of an oscillator according to an embodiment of this application.

In addition, when the oscillator is the DCO, the oscillator may further include a digital-to-analog converter (DAC). The DAC is configured to convert a digital voltage generated by the external sensing circuit into an analog voltage, to obtain the second voltage V2, where details are shown in FIG. 6 and FIG. 7. It should be noted that, in FIG. 6 and FIG. 7, an example in which the first voltage V1 is the positive voltage VDD supplied by the fixed power supply is used for description. The DAC is also applicable to an oscillator in which the first voltage V1 is the negative voltage VSS supplied by the fixed power supply. This is not described in detail in this embodiment of this application again. For example, the analog-to-digital converter includes a switch array, and a plurality of resistors connected in series with each other between a power supply terminal and a ground terminal. A connection point between two adjacent resistors among the plurality of resistors connected in series with each other is connected to one switch in the switch array. The analog-to-digital converter is configured to control a switch that is in the switch array and that corresponds the digital voltage to be closed, to convert the digital voltage into the analog voltage. In FIG. 6 and FIG. 7, S0 represents the first switch in the switch array, and SX represents the last switch in the switch array.

Because the oscillation frequency of the oscillator changes with the power supply signal of the oscillator, in this embodiment of this application, the power supply signal of the oscillator is formed by the fixed first voltage V1 and the variable second voltage V2. Therefore, when the oscillation frequency of the oscillator drifts because of an external factor and the like, the oscillation frequency of the oscillator can be compensated by adjusting the power supply signal, so that performance of the oscillator can be improved. Compared with the conventional technology, this reduces an occupied area of the oscillator and simplifies a design difficulty of the oscillator because a large quantity of varactors do not need to be disposed inside the oscillator.

Figure 8:
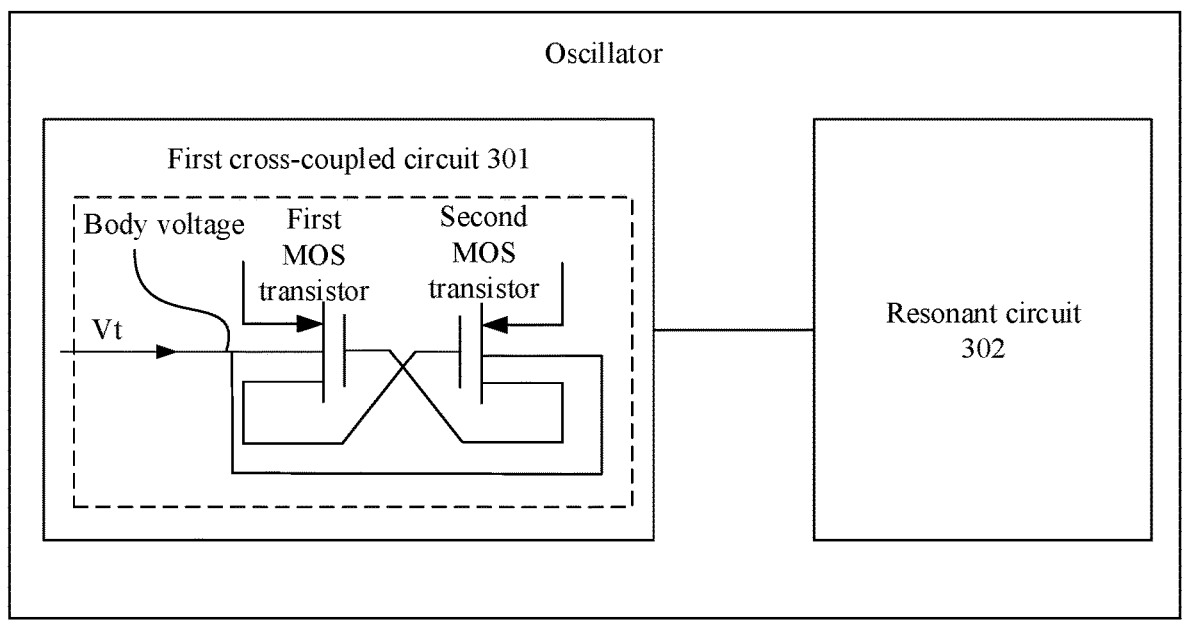
FIG. 8 is a schematic structural diagram 8 of an oscillator according to an embodiment of this application.

FIG. 8 is a schematic structural diagram of an oscillator according to an embodiment of this application. Refer to FIG. 8. The oscillator includes a first cross-coupled circuit 301 and a resonant circuit 302. The first cross-coupled circuit 301 is configured to compensate for energy consumption of the resonant circuit 302, namely, negative resistance compensation. The resonant circuit 302 is configured to generate an oscillator signal.

In this embodiment of this application, the first cross-coupled circuit 301 includes a first MOS transistor and a second MOS transistor that are cross-coupled, and a body (body) of the first MOS transistor and a body of the second MOS transistor are configured to receive a variable control voltage Vt. In this case, a voltage of the body (namely, a body voltage) of the first MOS transistor and a voltage of the body of the second MOS transistor are equal to the variable control voltage Vt. The bodies of the MOS transistors herein may specifically refer to poles corresponding to substrates in the MOS transistors.

The variable control voltage is a voltage generated based on at least one of the following parameters: a temperature, a mechanical pressure, or a mechanical vibration. Optionally, the variable control voltage Vt may be generated by an external sensing circuit. For example, the variable control voltage Vt may be a voltage generated by one of a temperature sensing circuit, a pressure sensing circuit, or a vibration sensing circuit. The temperature sensing circuit may generate a variable voltage based on a change of a temperature of the oscillator, the pressure sensing circuit may generate a variable voltage based on a change of a mechanical pressure received by the oscillator, or the vibration sensing circuit may generate a variable voltage based on changes of a frequency and magnitude of a vibration received by the oscillator.

Optionally, the external sensing circuit may be configured to generate the variable control voltage Vt based on a temperature, a mechanical pressure, a mechanical vibration, or the like of an external environment in which the oscillator is located. For example, the external sensing circuit generates the variable control voltage Vt based on a temperature, a mechanical pressure, a mechanical vibration, or the like of a chip in which the oscillator is located. For example, the oscillator may be used in a phase-locked loop. The external sensing circuit may be configured to compare a reference voltage with a loop voltage of the phase-locked loop to generate the variable control voltage Vt, or the variable control voltage Vt may be a voltage generated based on at least one of the following parameters of the phase-locked loop: a temperature, a mechanical pressure, or a mechanical vibration.

In practical application, the external sensing circuit may further include another sensing circuit. The another sensing circuit may be configured to detect a voltage generated by a change of another external factor (an external factor other than the temperature, the mechanical pressure, and the mechanical vibration) that affects an oscillation frequency of the oscillator. This is not specifically limited in this embodiment of this application.

Figure 9:
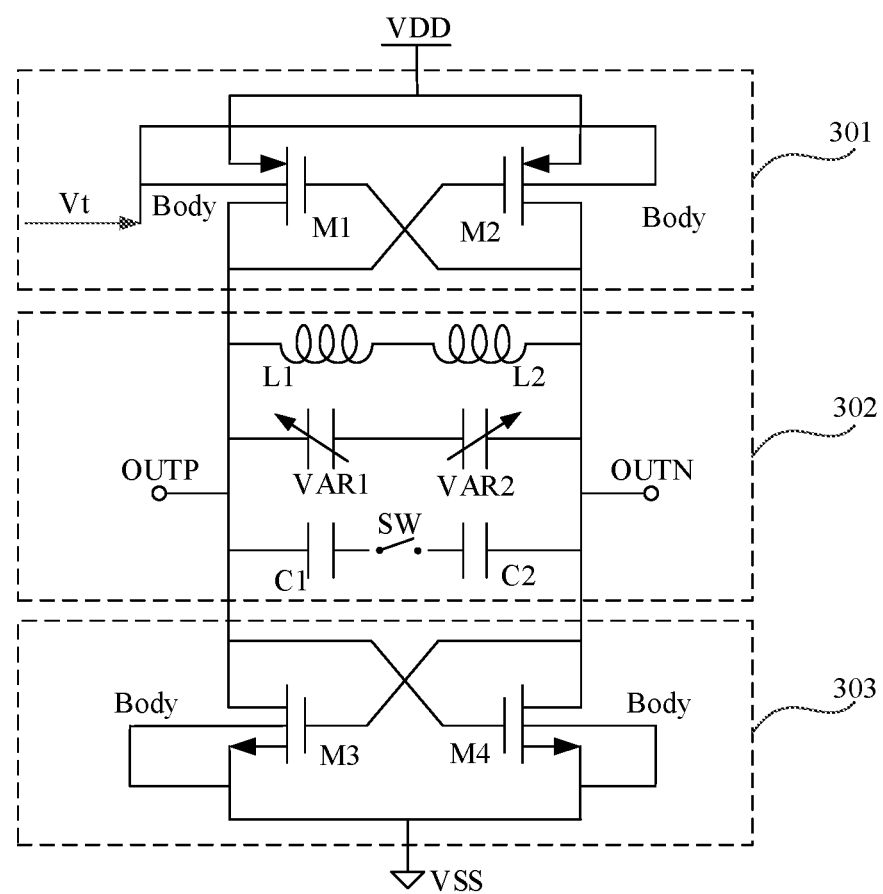
FIG. 9 is a schematic structural diagram 9 of an oscillator according to an embodiment of this application.
Figure 10:
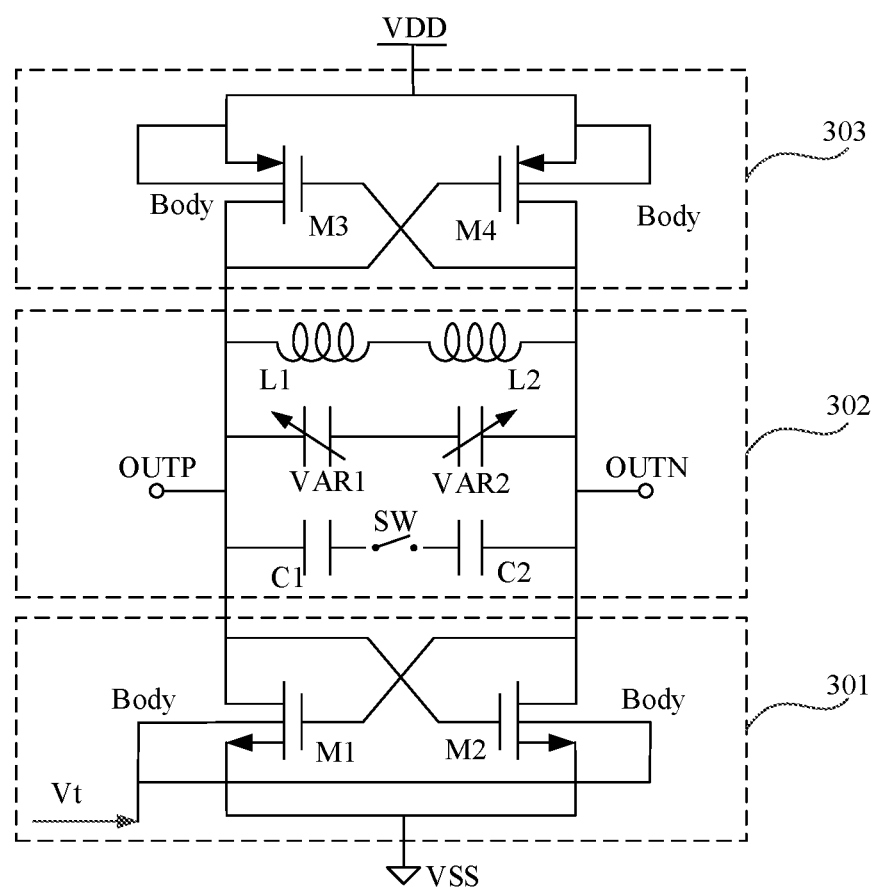
FIG. 10 is a schematic structural diagram 10 of an oscillator according to an embodiment of this application.
Figure 11:
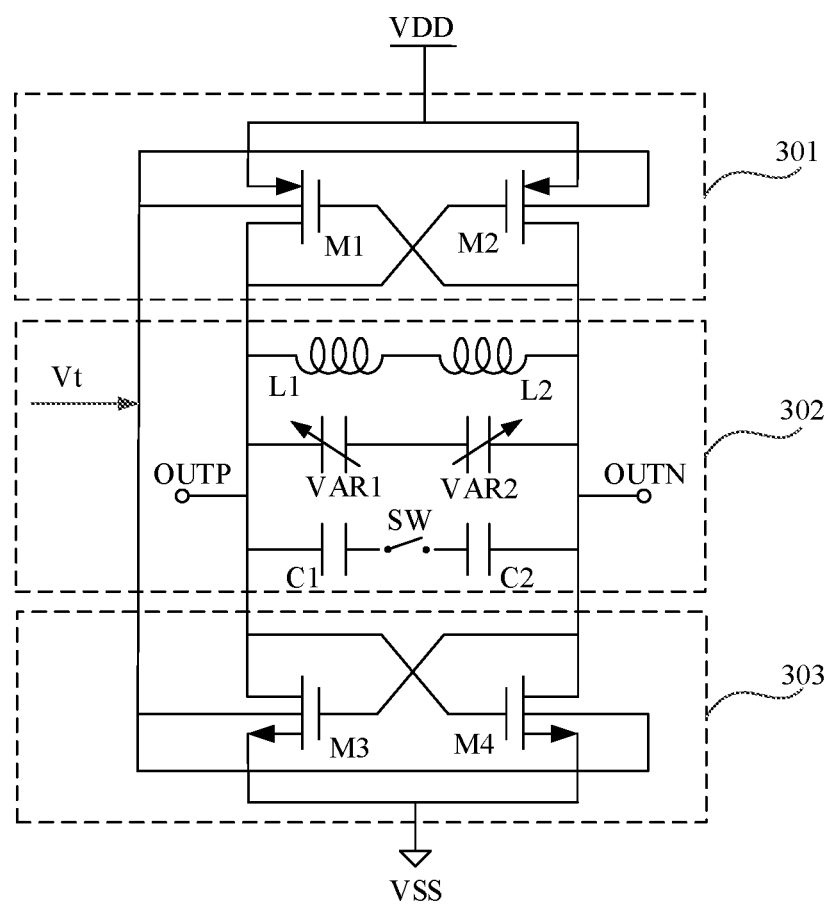
FIG. 11 is a schematic structural diagram 11 of an oscillator according to an embodiment of this application.

Specifically, as shown in FIG. 9 to FIG. 11, the first cross-coupled circuit 301 may include a first MOS transistor M1 and a second MOS transistor M2. A source of the first MOS transistor M1 and a source of the second MOS transistor M2 are coupled to a first node. A drain of the first MOS transistor M1, a gate of the second MOS transistor M2, and a first terminal of the resonant circuit 302 are coupled to a second node (denoted as OUTP). A gate of the first MOS transistor M1, a drain of the second MOS transistor M2, and a second terminal of the resonant circuit 302 are coupled to a third node (denoted as OUTN). OUTN and OUTP are configured to output an oscillator signal.

In practical application, the oscillator may include one cross-coupled circuit, or may include two cross-coupled circuits: the first cross-coupled circuit 301 and a second cross-coupled circuit 303. The second cross-coupled circuit 303 includes a third MOS transistor M3 and a fourth MOS transistor M4. A source of the third MOS transistor M3 and a source of the fourth MOS transistor M4 are coupled to a fourth node. A drain of the third MOS transistor M3 and a gate of the fourth MOS transistor M4 are coupled to OUT. A gate of the third MOS transistor and a drain of the fourth MOS transistor are coupled to OUTN. The first node is configured to receive a constant positive voltage VDD, and the fourth node is configured to receive a constant negative voltage VSS (the negative voltage VSS may be specifically a ground terminal GND).

In this embodiment of this application, the variable control voltage Vt may be used as a body (body) voltage of the first MOS transistor M1 and a body voltage of the second MOS transistor M2 in the first cross-coupled circuit 301. In this case, a body of the third MOS transistor M3 and a body of the fourth MOS transistor M4 in the second cross-coupled circuit 302 may be connected to the VSS, where details are shown in FIG. 9. Alternatively, the variable control voltage Vt may be used to control a body (body) voltage of the first MOS transistor M1 and a body voltage of the second MOS transistor M2 in the first cross-coupled circuit 301. In this case, a body of the third MOS transistor M3 and a body of the fourth MOS transistor M4 in the second cross-coupled circuit 302 may be connected to the VDD, where details are shown in FIG. 10. Alternatively, the variable control voltage Vt may be used to control a body (body) voltage of the first MOS transistor M1 and a body voltage of the second MOS transistor M2 in the first cross-coupled circuit 301, and control a body (body) voltage of the third MOS transistor M3 and a body voltage of the fourth MOS transistor M4 in the second cross-coupled circuit 303, where details are shown in FIG. 11.

It should be noted that, the MOS transistors included in the first cross-coupled circuit 301 and the second cross-coupled circuit 303 each may be a cross-coupled pair formed by using NMOS transistors, or may be a cross-coupled pair formed by using PMOS transistors. The first cross-coupled circuit 301 and the second cross-coupled circuit 303 in FIG. 9 to FIG. 11 are merely examples, and do not constitute any limitation on this embodiment of this application.

Optionally, as shown in FIG. 9 to FIG. 11, the resonant circuit 302 may include: a first inductor L1, a second inductor L2, a first varactor VAR1, a second varactor VAR2, and a switched capacitor array. In FIG. 9 to FIG. 11, an example in which the switched capacitor array includes a first capacitor C1 and a second capacitor C2, and one terminal of the first capacitor C1 is connected to one terminal of the second capacitor C2 by using a switch (SW) is used for description.

One terminal of the first varactor VAR1 is coupled to one terminal of the second varactor VAR2. One terminal of the first inductor L1 is coupled to one terminal of the second inductor L2. The other terminal of the first inductor L1, the other terminal of the first varactor VAR1, and one terminal of the switched capacitor array (which is specifically the other terminal of the first capacitor C1) are all coupled to OUTP. The other terminal of the second inductor L2, the other terminal of the second varactor VAR2, and the other terminal of the switched capacitor array (which is specifically the other terminal of the second capacitor C2) are all coupled to OUTN.

In practical application, the resonant circuit 302 may be alternatively a circuit of another structure. For example, the first inductor L1 and the second inductor L2 are implemented by using one inductor, and the switched capacitor array is a capacitor array of another form. The specific structure of the resonant circuit 302 in FIG. 9 to FIG. 11 is merely an example, and does not constitute any limitation on this embodiment of this application.

Further, the oscillator may be a voltage-controlled oscillator VCO or a digitally-controlled oscillator DCO. When the oscillator is the VCO, the first varactor VAR1 and the second varactor VAR2 in the resonant circuit 302 may be specifically controlled by an analog signal. When the oscillator is the DCO, the first varactor VAR1 and the second varactor VAR2 in the resonant circuit 302 may be specifically controlled by a digital signal.

Figure 12:
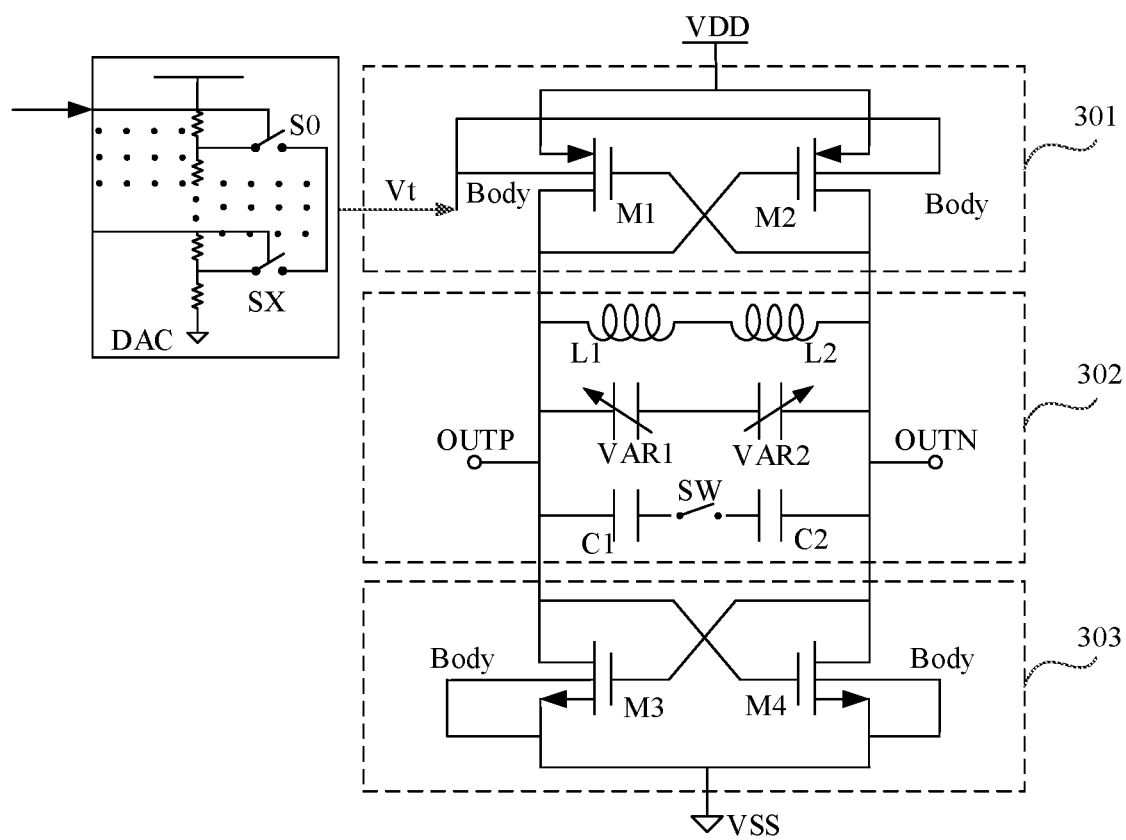
FIG. 12 is a schematic structural diagram 12 of an oscillator according to an embodiment of this application.

In addition, when the oscillator is the DCO, the oscillator may further include a DAC. The DAC is configured to convert a digital voltage generated by the external sensing circuit into an analog voltage, where details are shown in FIG. 12. It should be noted that, in FIG. 12, an example in which the variable control voltage Vt is used to control the body (body) voltage of the first MOS transistor M1 and the body voltage of the second MOS transistor M2 is merely used for description. The DAC is also applicable to the oscillator shown in FIG. 10 and FIG. 11, and details are not described in this embodiment of this application. For example, the analog-to-digital converter includes a switch array, and a plurality of resistors connected in series with each other between a power supply terminal and a ground terminal. A connection point between two adjacent resistors among the plurality of resistors connected in series with each other is connected to one switch in the switch array. The analog-to-digital converter is configured to control a switch that is in the switch array and that corresponds the digital voltage to be closed, to convert the digital voltage into the analog voltage. In FIG. 12, S0 represents the first switch in the switch array, and SX represents the last switch in the switch array.

Because the oscillation frequency of the oscillator changes with the body (body) voltages of the cross-coupled MOS transistors in the first cross-coupled circuit 301, in this embodiment of this application, the body (body) voltages of the MOS transistors in the first cross-coupled circuit 301 are controlled by the variable control voltage Vt. Therefore, when the oscillation frequency of the oscillator drifts because of an external factor and the like, the oscillation frequency of the oscillator can be compensated by adjusting the variable control voltage Vt, so that performance of the oscillator can be improved. In addition, compared with the conventional technology, this reduces an occupied area of the oscillator, and simplifies a design of the oscillator because a large quantity of varactors do not need to be disposed inside the oscillator.

Further, the oscillator shown in FIG. 1 to FIG. 12 may be used in a phase-locked loop, and the phase-locked loop may include a phase frequency detector, a filter, and an oscillator. When the oscillator is the VCO, the phase-locked loop may be an analog phase-locked loop. When the oscillator is the DCO, the phase-locked loop may be a digital phase-locked loop. Based on this, an embodiment of this application further provides a phase-locked loop. The phase-locked loop may include the oscillator provided in any one of FIG. 1 to FIG. 12.

For ease of description, an operating principle of the analog phase-locked loop and an operating principle of the analog phase-locked loop are described herein by using an example in which the second voltage V2 or the variable control voltage Vt in the oscillator comes from a temperature sensing circuit.

Figure 13:
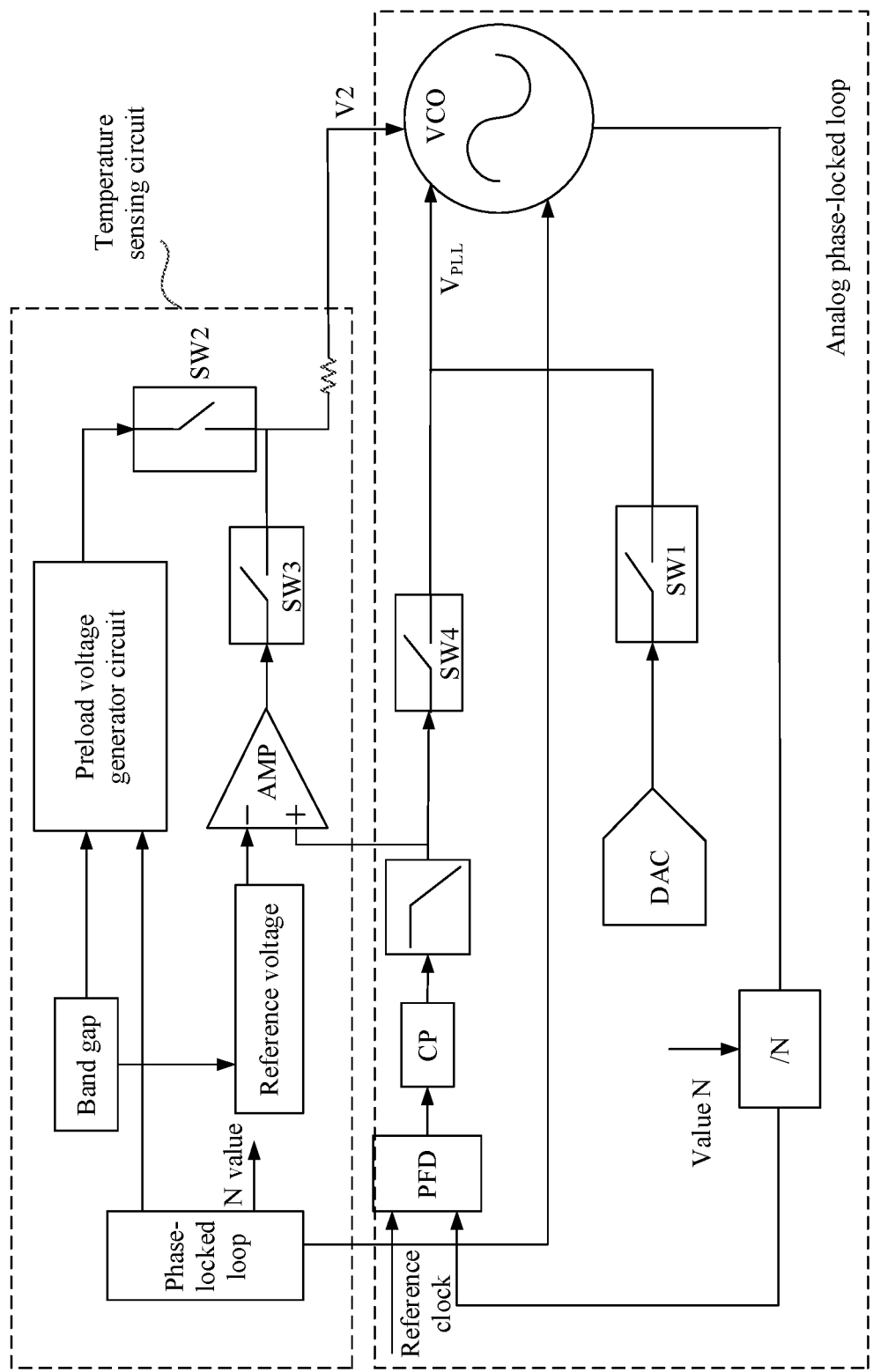
FIG. 13 is a schematic structural diagram of an analog phase-locked loop according to an embodiment of this application.

For example, when the oscillator is a VCO, the analog phase-locked loop in which the VCO is located and the temperature sensing circuit may be specifically shown in FIG. 13. A connection point of a phase-locked loop control voltage $V_{PLL}$ in FIG. 13 may be specifically a connection point between the first varactor VAR1 and the second varactor VAR2 in the resonant circuit of the oscillator. In FIG. 13, AMP represents an amplifier (amplifier), PFD represents a phase frequency detector (phase frequency detector), CP represents a charge pump (charge pump), DAC represents a digital-to-analog converter, and SW1 to SW4 represent four switches (switches).

A specific frequency compensation principle is as follows: When the phase-locked loop (phase lock loop, PLL) is stable, an entire loop of the PLL is in a stable state. In this case, $V_{PLL}$ is unchanged. When a temperature changes, a frequency of the VCO drifts, and the loop of the PLL re-locks an oscillation frequency to compensate for a change caused by the temperature. In this case, $V_{PLL}$ changes. After the change of $V_{PLL}$ is monitored by the AMP of the temperature sensing circuit, the temperature sensing circuit starts to generate a temperature-compensated voltage (namely, a second voltage V2) to compensate for a frequency change of the VCO that is caused by the temperature. In this way, $V_{PLL}$ does not greatly change, and the loop of the PLL does not re-lock the oscillation frequency, thereby implementing continuous locking of the oscillation frequency in the analog phase-locked loop.

Figure 14:
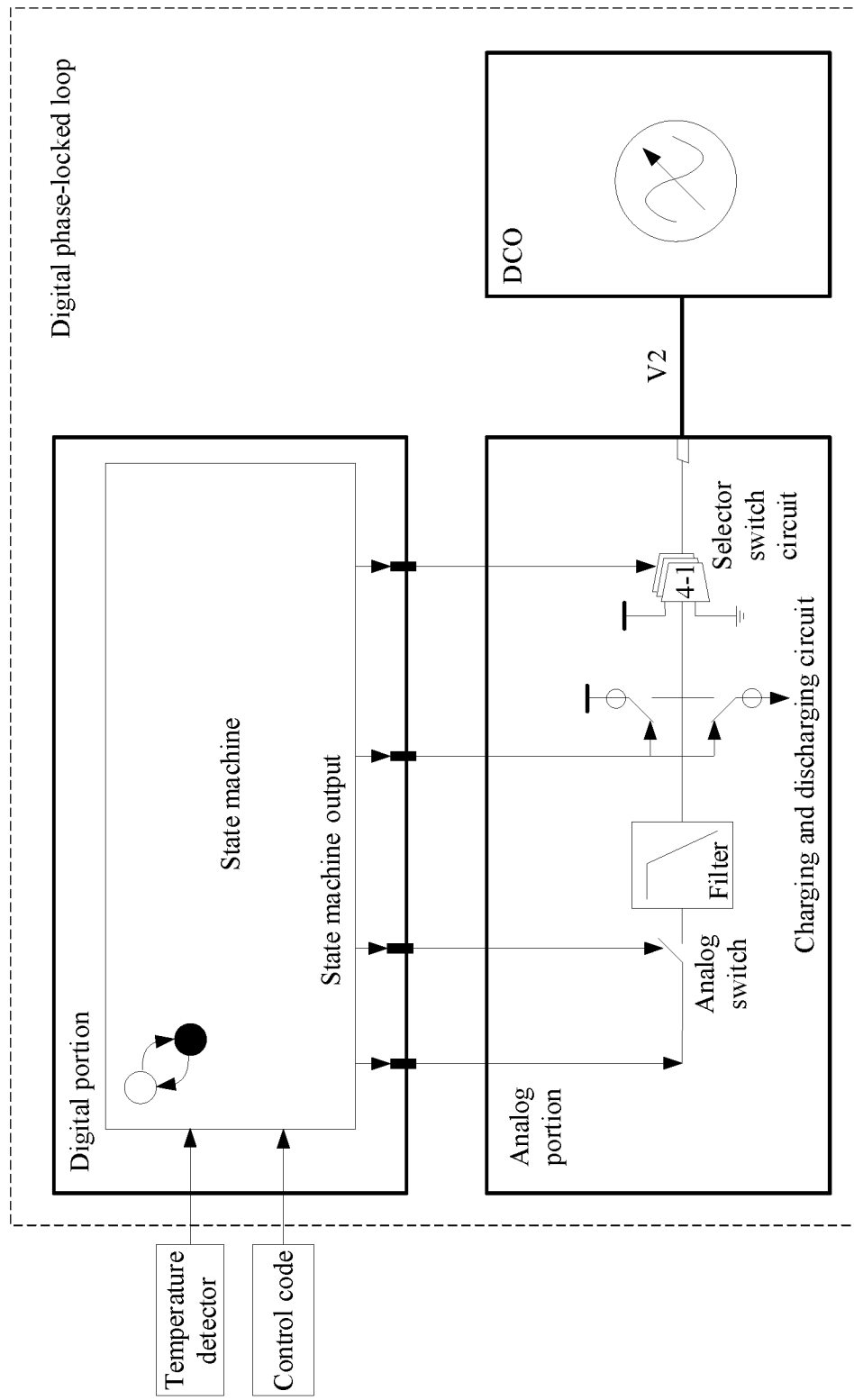
FIG. 14 is a schematic structural diagram of a digital phase-locked loop according to an embodiment of this application.

For example, when the oscillator is a DCO, the digital phase-locked loop in which the DCO is located and the temperature sensing circuit (which may be specifically a temperature detector) may be shown in FIG. 14. A connection point of a control code (FT_code) in FIG. 14 may be specifically a connection point between the first varactor VAR1 and the second varactor VAR2 in the resonant circuit of the oscillator. The digital phase-locked loop in FIG. 14 may be divided into a digital portion and an analog portion. The digital portion may include a state machine, and the analog portion may include an analog switch, a filter, a charging and discharging circuit, and a selector switch circuit.

A specific frequency compensation principle is as follows: When the PLL is stable, an entire loop of the PLL is in a stable state. In this case, the control code (FT_code) is unchanged. When a temperature changes, a frequency of the DCO drifts, and the loop of the PLL re-locks an oscillation frequency to compensate for a change caused by the temperature. In this case, the control code (FT_code) changes. After the change of the control code (FT_code) is monitored by the temperature detector, the temperature detector starts to generate a temperature-compensated voltage (namely, a second voltage V2) to compensate for a frequency change of the DCO that is caused by the temperature. In this way, the control code (FT_code) does not greatly change, and the loop of the PLL does not re-lock the oscillation frequency, thereby implementing continuous locking of the oscillation frequency in the digital phase-locked loop.

An embodiment of this application further provides an oscillator-based apparatus. The apparatus may be a terminal, a base station, a chip built in the terminal or the base station, or the like. The apparatus may include: a radio frequency circuit, and an oscillator provided in the embodiments of this application. The oscillator is configured to supply a local carrier signal for the radio frequency circuit.

When the oscillator-based apparatus is a terminal or a chip built in the terminal, the radio frequency circuit may include any one or a combination of the following: a cellular mobile communications module, a Bluetooth module, a wireless fidelity (Wi-Fi) module, or any radio frequency apparatus requiring a local carrier signal in the terminal. For example, the radio frequency circuit in the terminal may be a Bluetooth module and a Wi-Fi module, or may be the Bluetooth module or the Wi-Fi module.

When the oscillator-based apparatus is a base station or a chip built in a base station, the radio frequency circuit in the apparatus may be a transceiver, and the apparatus may further include a phase-locked loop. The phase-locked loop includes an oscillator, and the oscillator is configured to supply a local carrier signal for the transceiver by using the phase-locked loop.

It should be noted that, the terminal and the base station are merely examples for describing application of an oscillator product provided in the embodiments of this application, and do not limit the application of the oscillator provided in the embodiments of this application. The oscillator provided in the embodiments of this application may be used in any scenario in which frequency drift needs to be compensated and any product for which frequency drift needs to be compensated.

In the embodiments provided in this application, it should be understood that, the oscillator, the phase-locked loop, the external sensing circuit, the oscillator-based apparatus, and the like that are disclosed may further be implemented in another manner. For example, the described embodiments are merely examples. For example, the oscillator division is merely logical function division and may be other division in actual implementation. For example, a plurality of components may be combined or integrated into another component, or some features may be ignored or not performed. In addition, the displayed or discussed mutual signal transmission or communication may be implemented through some interfaces. The indirect couplings or communication connections between components or units may be performed in electrical, mechanical, or other forms.

The circuits described as separate parts may or may not be physically separate, and parts displayed as circuit units may be one or more physical units, may be located in one place, or may be distributed on different places. Some or all of the circuits may be selected based on actual requirements to achieve the objectives of the solutions of the embodiments.

In addition, functional circuits in the embodiments of this application may be integrated into one integrated circuit for processing, or each circuit unit may exist alone physically, or two or more circuit units may be integrated.

In conclusion, the foregoing descriptions are merely specific implementations of this application, but are not intended to limit the protection scope of this application. Any variation or replacement within the technical scope disclosed in this application shall fall within the protection scope of this application. Therefore, the protection scope of this application shall be subject to the protection scope of the claims.

The invention claimed is:

1. An oscillator, comprising:
a resonant circuit, configured to generate an oscillator signal;
a first cross-coupled transistor, coupled to the resonant circuit;
a power supply circuit, configured to supply a power supply signal for the first cross-coupled transistor based on a first voltage and a second voltage, wherein the first voltage is a power supply voltage, and the second voltage is a voltage generated by an external sensing circuit based on a mechanical pressure or a mechanical vibration; and
wherein the power supply signal is a voltage signal, the power supply circuit comprises an adder, and the adder is configured to add the first voltage and the second voltage to obtain the voltage signal.

2. The oscillator according to claim 1, wherein the first voltage is a fixed voltage, and the second voltage is a variable voltage.

3. The oscillator according to claim 1, wherein:
the first cross-coupled transistor comprises a first MOS transistor and a second MOS transistor;
a source of the first MOS transistor and a source of the second MOS transistor are coupled to a first node;
a gate of the first MOS transistor, a drain of the second MOS transistor, and a first terminal of the resonant circuit are coupled to a second node;
a drain of the first MOS transistor, a gate of the second MOS transistor, and a second terminal of the resonant circuit are coupled to a third node; and
the first node is configured to receive the power supply signal.

4. The oscillator according to claim 3, wherein:
the oscillator further comprises a second cross-coupled transistor;
the second cross-coupled transistor comprises a third MOS transistor and a fourth MOS transistor;
a source of the third MOS transistor and a source of the fourth MOS transistor are coupled to a fourth node;
a gate of the third MOS transistor, a drain of the fourth MOS transistor, and the first terminal of the resonant circuit are coupled to the second node;
a drain of the third MOS transistor, a gate of the fourth MOS transistor, and the second terminal of the resonant circuit are coupled to the third node; and
the fourth node is coupled to a positive terminal or a negative terminal of a power supply.

5. The oscillator according to claim 3, wherein:
the resonant circuit comprises an inductor, a first varactor, a second varactor, and a switched capacitor array;
two terminals of the inductor are coupled to the second node and the third node;
one terminal of the first varactor is coupled to one terminal of the second varactor;
another terminal of the first varactor and another terminal of the second varactor are respectively coupled to the second node and the third node; and
two terminals of the switched capacitor array are coupled to the second node and the third node.

6. The oscillator according to claim 1, wherein the oscillator further comprises:
a digital-to-analog converter, configured to convert a digital voltage into an analog voltage to obtain the second voltage when a voltage generated by the external sensing circuit is a digital voltage.

7. An oscillator-based apparatus, wherein the oscillator-based apparatus comprises:
a radio frequency circuit; and
an oscillator, wherein the oscillator is configured to supply a local carrier signal for the radio frequency circuit, and wherein the oscillator comprises:
a resonant circuit, configured to generate an oscillator signal;
a first cross-coupled transistor, coupled to the resonant circuit; and
a power supply circuit, configured to supply a power supply signal for the first cross-coupled transistor based on a first voltage and a second voltage, wherein the first voltage is a power supply voltage, and the second voltage is a voltage generated by an external sensing circuit based on a mechanical pressure or a mechanical vibration; and
wherein the power supply signal is a voltage signal, the power supply circuit comprises an adder, and the adder is configured to add the first voltage and the second voltage to obtain the voltage signal.

8. The oscillator-based apparatus according to claim 7, wherein the first voltage is a fixed voltage, and the second voltage is a variable voltage.

9. The oscillator-based apparatus according to claim 7, wherein:
the first cross-coupled transistor comprises a first MOS transistor and a second MOS transistor;
a source of the first MOS transistor and a source of the second MOS transistor are coupled to a first node;
a gate of the first MOS transistor, a drain of the second MOS transistor, and a first terminal of the resonant circuit are coupled to a second node;
a drain of the first MOS transistor, a gate of the second MOS transistor, and a second terminal of the resonant circuit are coupled to a third node; and
the first node is configured to receive the power supply signal.

10. The oscillator-based apparatus according to claim 9, wherein:
the oscillator further comprises a second cross-coupled transistor;
the second cross-coupled transistor comprises a third MOS transistor and a fourth MOS transistor;
a source of the third MOS transistor and a source of the fourth MOS transistor are coupled to a fourth node;
a gate of the third MOS transistor, a drain of the fourth MOS transistor, and the first terminal of the resonant circuit are coupled to the second node;
a drain of the third MOS transistor, a gate of the fourth MOS transistor, and the second terminal of the resonant circuit are coupled to the third node; and
the fourth node is coupled to a positive terminal or a negative terminal of a power supply.

11. The oscillator-based apparatus according to claim 9, wherein:
the resonant circuit comprises an inductor, a first varactor, a second varactor, and a switched capacitor array;
two terminals of the inductor are coupled to the second node and the third node;
one terminal of the first varactor is coupled to one terminal of the second varactor;
another terminal of the first varactor and another terminal of the second varactor are respectively coupled to the second node and the third node; and
two terminals of the switched capacitor array are coupled to the second node and the third node.

12. The oscillator-based apparatus according to claim 7, wherein the oscillator further comprises:
a digital-to-analog converter, configured to convert a digital voltage into an analog voltage to obtain the second voltage when a voltage generated by the external sensing circuit is a digital voltage.

\* \* \* \* \*